(12) United States Patent
Yamagishi et al.

(10) Patent No.: US 7,772,562 B2
(45) Date of Patent: Aug. 10, 2010

(54) RADIATION DETECTOR

(75) Inventors: Shirofumi Yamagishi, Nasushiobara (JP); Hitoshi Chiyoma, Otawara (JP)

(73) Assignees: Kabushiki Kaisha Toshiba, Tokyo (JP); Toshiba Electron Tubes & Devices Co., Ltd., Tochigi-ken (JP)

( * ) Notice: Subject to any disclaimer, the term of this patent is extended or adjusted under 35 U.S.C. 154(b) by 0 days.

(21) Appl. No.: 12/490,462

(22) Filed: Jun. 24, 2009

(65) Prior Publication Data

US 2010/0019162 A1 Jan. 28, 2010

Related U.S. Application Data

(63) Continuation of application No. PCT/JP2007/074721, filed on Dec. 21, 2007.

(30) Foreign Application Priority Data

Dec. 27, 2006 (JP) .............................. 2006-351820

(51) Int. Cl.
*G01T 1/20* (2006.01)
(52) U.S. Cl. ................................. 250/370.11
(58) Field of Classification Search ........... 250/370.01–370.15; 378/98.8
See application file for complete search history.

(56) References Cited

U.S. PATENT DOCUMENTS

2003/0155516 A1 * 8/2003 Spartiotis et al. ....... 250/370.09
2004/0200971 A1 * 10/2004 De Keyser ............. 250/370.09

FOREIGN PATENT DOCUMENTS

| JP | 09-260626 | 10/1997 |
| JP | 2002-048870 | 2/2002 |
| JP | 2002-048872 | 2/2002 |
| JP | 2002-050754 | 2/2002 |

OTHER PUBLICATIONS

International Search Report for PCT/JP2007/074721.

\* cited by examiner

*Primary Examiner*—David P Porta
*Assistant Examiner*—Kiho Kim
(74) *Attorney, Agent, or Firm*—Pillsbury Winthrop Shaw Pittman, LLP

(57) ABSTRACT

In a radiation detector in which scintillator layers are directly formed on all the light receiving parts of a plurality of photoelectric conversion substrates, space and level difference between the adjacent photoelectric conversion substrates are determined so that the effects of these space and level difference fall within a range corresponding to the effect of one photoelectric conversion element. Specifically, the space between the adjacent photoelectric conversion substrates is equal to or less than 133 μm and the level difference between the adjacent photoelectric conversion substrates is equal to or less than 100 μm. Accordingly, the scintillator layers can be directly formed on all the light receiving parts of the plurality of photoelectric conversion substrates. This prevents degradation in MTF and sensitivity and reduces manufacturing costs.

8 Claims, 3 Drawing Sheets

RADIATION DETECTOR

CROSS REFERENCE TO RELATED APPLICATIONS

This is a Continuation Application of PCT Application No. PCT/JP2007/074721, filed Dec. 21, 2007, which was published under PCT Article 21(2) in Japanese.

This application is based upon and claims the benefit of priority from prior Japanese Patent Application No. 2006-351820, filed Dec. 27, 2006, the entire contents of which are incorporated herein by reference.

BACKGROUND OF THE INVENTION

1. Field of the Invention

The present invention relates to radiation detectors that produce large-area radiographic images by arranging a plurality of photoelectric conversion substrates.

2. Description of the Related Art

Planer x-ray detectors, which convert an x-ray image transmitted through a human body or the like into an electric signal, have become practical for use as medical x-ray diagnostic equipment. Most x-ray detectors that are used presently comprise: a photoelectric conversion substrate in which a light receiving part is formed from a substrate and a plurality of photoelectric conversion elements, such as photodiodes, arranged on the substrate two-dimensionally; and a scintillator layer formed on the light receiving part of the photoelectric conversion substrate. Such x-ray detectors convert x-rays transmitted through a human body or the like into visible light by means of the scintillator layer, convert the visible light into an electric signal by means of the photoelectric conversion elements of the photoelectric conversion substrate, and output this electric signal. In the photoelectric conversion substrate, a circuit board is formed from thin film transistors (TFT) arranged two-dimensionally, and the photoelectric conversion elements electrically connected to the thin film transistors are two-dimensionally arranged on this circuit board.

Radiographing a chest region (for example) requires a large-area x-ray detector. However, the larger the area becomes, the lower the yield becomes in the manufacture of photoelectric conversion substrates, and a larger manufacturing device and hence higher manufacturing cost are required for the photoelectric conversion substrates.

To overcome the foregoing problems, photoelectric conversion elements the area of each of which is smaller than the entire light receiving area of the x-ray detector are used, and the photoelectric conversion substrates are arranged to acquire a larger area. This prevents a decrease in yield per photoelectric conversion substrate and reduces the manufacturing cost.

However, where a large area is acquired by arranging a plurality of photoelectric conversion substrates, and scintillator layers are formed on the plurality of photoelectric conversion substrates, resolution diminishes in the boundaries (i.e., joints) between the adjacent photoelectric conversion substrates. To avoid this, all the photoelectric conversion substrates, including boundaries between one another, are covered with a transparent film in order to form a flat surface, and a scintillator layer is formed on this transparent film (refer to, for example, Jpn. Pat. Appln. KOKAI Publication No. 2002-48872, page 3 and FIG. 3).

BRIEF SUMMARY OF THE INVENTION

However, where a plurality of photoelectric conversion substrates are arranged to acquire a larger area, then all the photoelectric conversion substrates, including boundaries between one another, are covered with a transparent film to form a flat surface, and a scintillator layer is formed on the transparent film, MTF (modulation Transfer Function) and sensitivity may degrade on account of the area of the transparent film. In addition, the cost of the material of the transparent film and the cost of forming the transparent film are also required.

The present invention was proposed in view of the foregoing problems. The object of the present invention is, accordingly, to provide a radiation detector that prevents degradation in MTF and sensitivity and reduces manufacturing costs by defining conditions under which fewer adverse effects are produced even where scintillator layers are directly formed on all the light receiving parts of photoelectric conversion substrates.

The present invention comprises a plurality of photoelectric conversion substrates each of which has a light receiving part formed from a substrate and a plurality of photoelectric conversion elements arranged on the substrate two-dimensionally; a base on which the plurality of photoelectric conversion substrates are arranged so that the light receiving parts are adjacent; and scintillator layers directly formed on all the light receiving parts of the photoelectric conversion substrates, wherein the space and level difference between the adjacent photoelectric conversion substrates are determined so that the effects of these space and level difference fall within a range corresponding to the effect of one photoelectric conversion element.

DETAILED DESCRIPTION OF THE INVENTION

Figure 1:
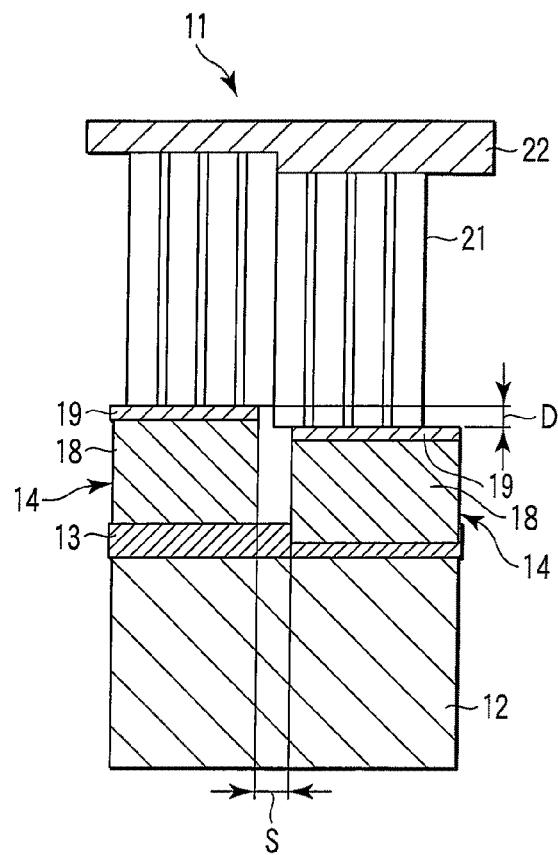
FIG. 1 is a sectional view of a part of a radiation detector according to one embodiment of the present invention.
Figure 2:
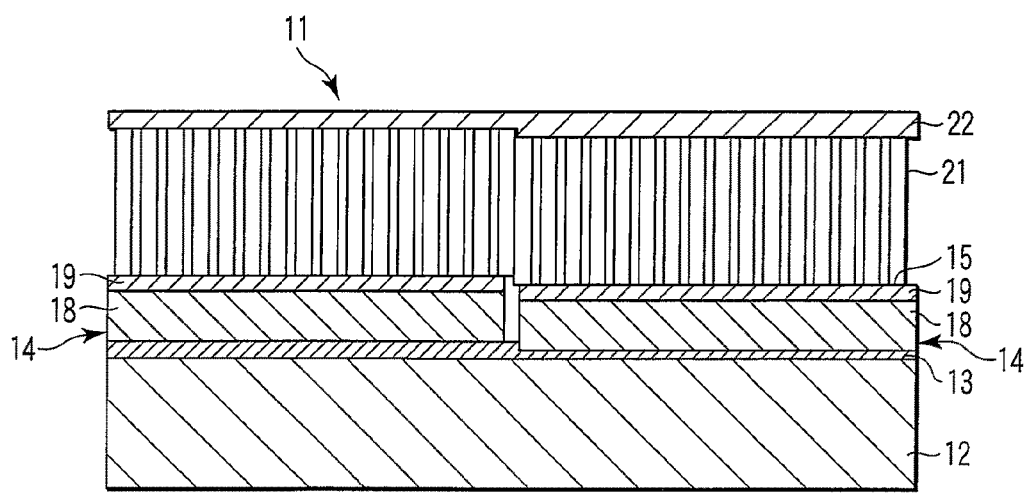
FIG. 2 is a sectional view of the same radiation detector.
Figure 3:
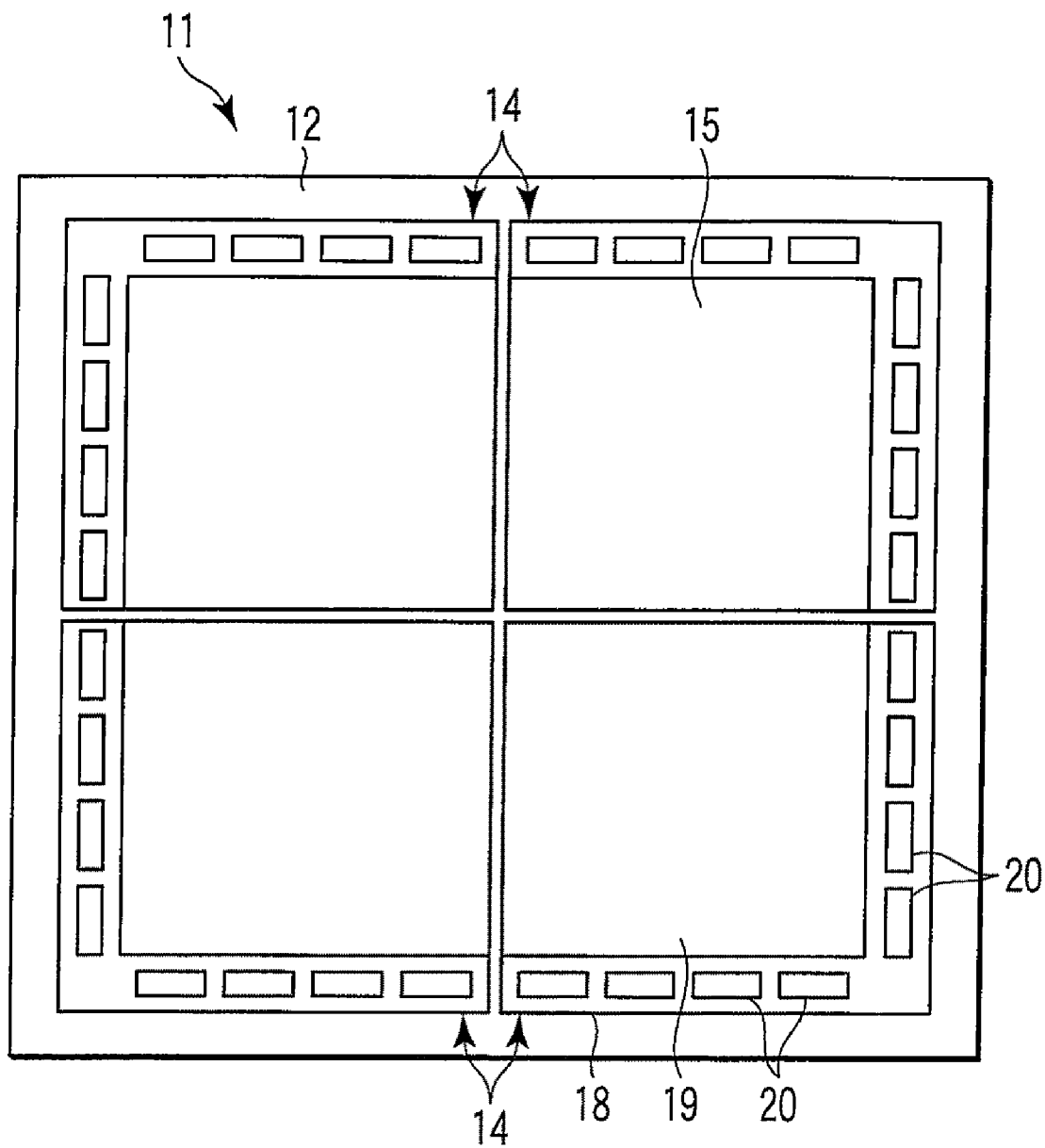
FIG. 3 is a front view of the radio detector in which a plurality of photoelectric conversion substrates are arranged on a substrate.

Referring to FIGS. 1 to 3, there is shown a radiation detector 11, which includes a base 12 made of, e.g., glass; and a plurality of photoelectric conversion substrates 14, serving as imaging substrates, which are fixed on the base 12 via an adhesive 13 so as to be adjacent in one plane. Specifically, four quadrangular photoelectric conversion substrates 14 are arranged in a plane on the quadrangular substrate 12 such that two of the four sides of each of the four photoelectric conversion substrates 14 are adjacent to other photoelectric conversion substrates 14. Thus, one quadrangular light-receiving face 15 of a large area is formed.

The base 12 is supported so that the dimension of a space S between the adjacent photoelectric conversion substrates 14 in the planar direction and the dimension of a level difference D perpendicular to the plane are smaller than the dimension of each side of the light receiving face of each of the photoelectric conversion elements.

Each of the photoelectric conversion substrates 14 has a glass substrate 18. On the substrate 18 are thin film transistors (TFT) arranged two-dimensionally. On each of the thin film transistors are photoelectric conversion elements, such as photodiodes, arranged two dimensionally. These thin film transistors, photoelectric conversion elements, etc., form a light receiving part 19 for converting light into an electric signal.

Each of the light receiving parts 19 extends to the two sides of the four sides of each of the photoelectric conversion substrates 14 which are adjacent to other photoelectric conversion substrates 14. An interspace is defined between each of the remaining two sides and the light receiving part 19. Formed in each of the interspaces are electrode pads 20 connected to the corresponding thin film transistors.

Directly formed over the entire light receiving part 19 of the plurality of photoelectric conversion substrates 14 are scintillator layers 21 of a cylindrical crystalline structure. The scintillator layers 21 convert incident radiation into light of a sensitivity detectable by the light receiving parts 19. The thickness of the scintillator layers 21 lies in the range from 100 μm to 1000 μm. As a material for the scintillator layers 21, CsI subjected to TI doping, which has high light emission efficiency, is generally used.

Formed on the scintillator layers 21 is a protective film sealing the scintillator layers 21 and protecting them from humidity. The material for the protective film 22 is, e.g., one in which particles of titanium dioxide are bonded with a resin in order to prevent reflection and separation of the moisture-proof film and the scintillator layers 21 from each other.

However, where a plurality of photoelectric conversion substrates 14 are arranged in order to acquire a large area, and scintillator layers 21 are directly formed on all the light receiving parts 19 of these photoelectric conversion substrates 14, resolution may diminish in the boundaries (i.e., joints) between the adjacent photoelectric conversion substrates 14.

Accordingly, research was conducted to find conditions under which the scintillator layers 21 directly formed on all the right receiving parts 19 of the plurality of photoelectric conversion substrates 14 produced fewer adverse effects.

An image affected by the space S or level difference D between the adjacent photoelectric conversion substrates 14 results in a shadow (i.e., a black line). Tables 1 and 2 show the results of the research of the interrelation between the length of the space S and the length of the shadow (i.e., black line) and the interrelation between the length of the level difference D and the length of the shadow (i.e., black line) respectively. Specifically, Table 1 shows the interrelation between the space defined between the adjacent photoelectric conversion substrates 14 of the radiation detector 11 and the length of the shadow (i.e., a black line), and Table 2 shows the interrelation between the level difference between the adjacent photoelectric conversion substrates 14 of the radiation detector and the length of the shadow (i.e., a black line).

TABLE 1

| Space [μm] of photoelectric conversion substrate | Length [μm] of shadow (black line) on image |
| --- | --- |
| 50 | 75 |
| 100 | 150 |

TABLE 1-continued

| Space [μm] of photoelectric conversion substrate | Length [μm] of shadow (black line) on image |
| --- | --- |
| 150 | 225 |
| 200 | 300 |

TABLE 2

| Level difference [μm] of photoelectric conversion substrate | Length [μm] of shadow (black line) on image |
| --- | --- |
| 10 | 20 |
| 20 | 40 |
| 30 | 60 |
| 40 | 80 |
| 50 | 100 |
| 60 | 120 |
| 70 | 140 |
| 80 | 160 |
| 90 | 180 |
| 100 | 200 |

It is most preferable that the length of the shadow (black line) of an image be equal to or shorter than the length corresponding to one photoelectric conversion element of each light receiving part 19. To be specific, where the length of one photoelectric conversion element of the light receiving part 19 is 150 μm, the length of the shadow (black line) of an image is equal to or shorter than 150 μm; and where the length of one photoelectric conversion element of the light receiving part 19 is 200 μm, the length of the shadow (black line) of the image is equal to or shorter than 200 μm.

It is found from Tables 1 and 2 that it is preferable that if the length of the shadow (black line) of the image is 150 μm, the space S be 100 μm or shorter and the level difference D be 75 μm or shorter, and that if the length of the shadow (black line) of the image is 200 μm, the space S be 133 μm or shorter and the level difference D be 100 μm or shorter.

Figure 4:
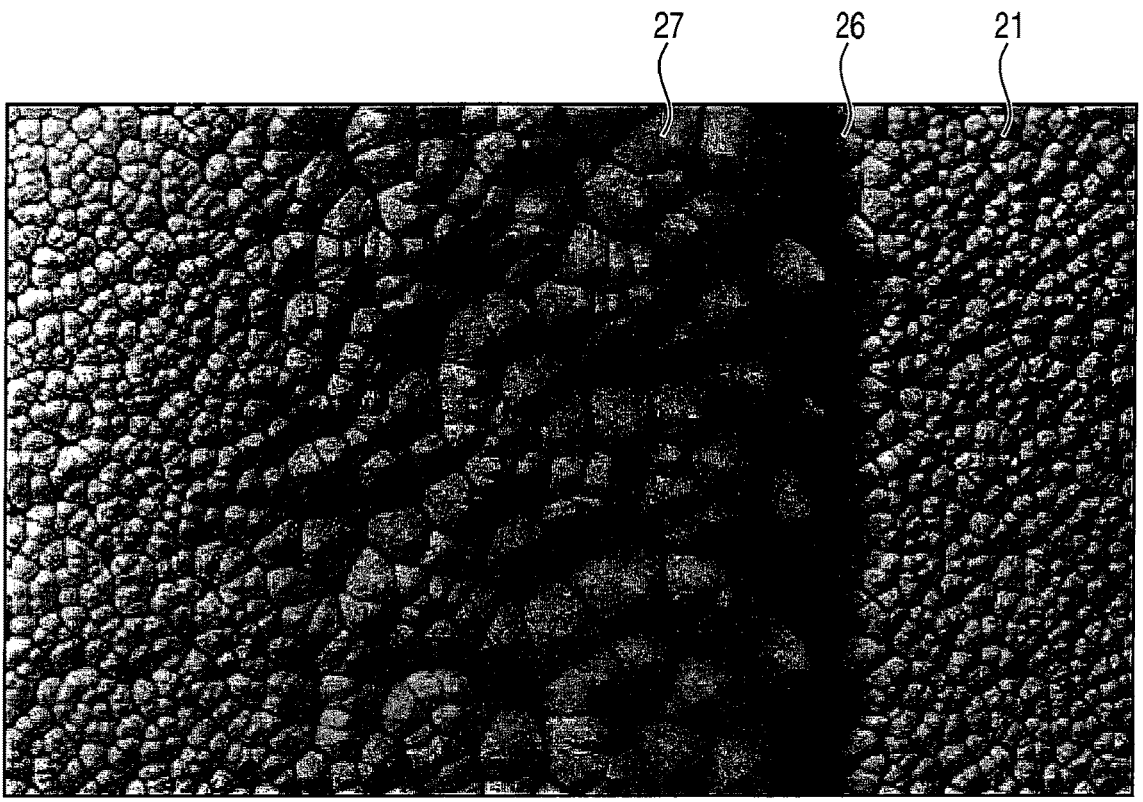
FIG. 4 is a microphotograph of a scintillator layer formed on adjacent photoelectric conversion substrates of the radiation detector.

In addition, as a result of checking MTF, decrease in MTF was found in the area of the shadow (black line), but no decrease in MTF was found in any areas other than the area of the shadow (black line). This is because, as shown in FIG. 4, an abnormal development 27 of the scintillator layer 21 occurred in the area of the shadow (black line), that is, in the area of the level difference 26, and the area of the abnormal development 27 led to the decrease in MTF.

As is clear from the foregoing, determining the space S and level difference D between the adjacent photoelectric conversion substrates 14 so that the effects of the space S and level difference D fall within a range corresponding to the effect of one photoelectric conversion element makes it possible to define conditions under which fewer adverse effects of the space S and level difference D are produced even if the scintillator layers 21 are directly formed on all the light receiving parts 19 of the plurality of photoelectric conversion substrates 14.

This eliminates the conventional need to form a scintillator layer after covering all photoelectric conversion substrates with a transparent film. Accordingly, since the scintillator layers 21 can be directly formed on all the light receiving parts 19 of the photoelectric conversion substrates 14, degradation in MTF and sensitivity can be prevented and manufacturing costs can also be reduced.

Additionally, in images derived from the radiation detector 11, each boundary (i.e., joint) between the adjacent photoelectric conversion substrate 14 results in a shadow (i.e., black line). Specifically, images corresponding to lines of vertical and lateral photoelectric conversion elements passing through the center of the image are shown as a blank.

To combat this, the radiation detector 11 is equipped with a correcting means, which is a soft function by which an image corresponding to one line of each photoelectric conversion element, which is shown in blank, is corrected based on an image corresponding to the other line adjacent to this photoelectric conversion element 1. This makes it possible to obtain a blank-free image even where the plurality of photoelectric conversion substrates 14 are arranged so as to increase an area.

According to the present invention, determining the space and level difference between the adjacent photoelectric conversion substrates so that the effects of these space and level difference fall within a range corresponding to the effect of one photoelectric conversion element makes it possible to define conditions under which fewer adverse effects of the space S and level difference D are produced even if the scintillator layers are directly formed on all the light receiving parts of the plurality of photoelectric conversion substrates. Accordingly, since the scintillator layers can be directly formed on all the light receiving parts of the photoelectric conversion substrates, degradation in MTF and sensitivity can be prevented and manufacturing costs can also be reduced.

What is claimed is:

1. A radiation detector comprising:
   a plurality of photoelectric conversion substrates each of which has a light receiving part formed from a substrate and a plurality of photoelectric conversion elements arranged on the substrate two-dimensionally;
   a base on which the plurality of photoelectric conversion substrates are arranged so that the light receiving parts are adjacent; and
   scintillator layers directly formed on all the light receiving parts of the photoelectric conversion substrates,
   wherein the base supports the photoelectric conversion substrates so that the dimension of the space in the direction of the plane in which the photoelectric conversion substrates are arranged adjacently and the dimension of a level difference perpendicular to the plane are smaller than the dimension of one of the sides of one light receiving part of each of the photoelectric conversion elements.

2. A radiation detector according to claim 1,
   wherein the space between the adjacent photoelectric conversion substrates is equal to or less than 133 μm and the level difference between the adjacent photoelectric conversion substrates is equal to or less than 100 μm.

3. A radiation detector according to claim 1,
   wherein the thickness of the scintillator layers is from 100 μm to 1000 μm.

4. A radiation detector according to claim 1,
   wherein a protective film covers and seals the scintillator layers.

5. A radiation detector according to claim 1,
   wherein a correcting means by which an image corresponding to one line of each photoelectric conversion element, which image is affected by the space and level difference between the adjacent photoelectric conversion substrates, is corrected based on an image corresponding to the other line adjacent to this photoelectric conversion element 1.

6. A radiation detector according to claim 1,
   wherein the dimension of the shadow formed on an image is 1.5 or less times that of the space defined between the adjacent photoelectric conversion substrates.

7. A radiation detector according to claim 1,
   wherein the dimension of the shadow formed on an image is 2 or less times of that of the level difference made between the adjacent photoelectric conversion substrates.

8. A radiation detector comprising:
   a plurality of photoelectric conversion substrates each of which has a light receiving part formed from a substrate and a plurality of photoelectric conversion elements arranged on the substrate two-dimensionally;
   a base on which the plurality of photoelectric conversion substrates are arranged so that the light receiving parts are adjacent; and
   scintillator layers directly formed on all the light receiving parts of the photoelectric conversion substrates,
   wherein the space and level difference between the adjacent photoelectric conversion substrates are determined so that the effects of these space and level difference fall within a range corresponding to the effect of one photoelectric conversion element.

* * * * *